(12) United States Patent
Lin et al.

(10) Patent No.: US 8,753,797 B2
(45) Date of Patent: Jun. 17, 2014

(54) SURFACE-MODIFIED MIDDLE LAYERS

(75) Inventors: Fang Lin, Zhubei (TW); Ching-Yu Chang, Yuansun Village, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/543,582

(22) Filed: Jul. 6, 2012

(65) Prior Publication Data

US 2014/0011139 A1    Jan. 9, 2014

(51) Int. Cl.
*G03F 7/26* (2006.01)
(52) U.S. Cl.
USPC ............................................................ 430/311
(58) Field of Classification Search
USPC ............................................................ 430/322
See application file for complete search history.

(56) References Cited

U.S. PATENT DOCUMENTS 6,183,872 B1 *    2/2001    Tanaka et al. ................. 428/429

FOREIGN PATENT DOCUMENTS

JP            09054440       *    2/1997

* cited by examiner

*Primary Examiner* — Kathleen Duda
*Assistant Examiner* — Caleen Sullivan
(74) *Attorney, Agent, or Firm* — Haynes and Boone, LLP

(57) ABSTRACT

Methods and materials for making a semiconductor device are described. The method includes providing a substrate, forming a surface-modified middle layer (SM-ML) that includes a fluorine-containing material over the substrate, forming a photoresist layer over the SM-ML, exposing the photoresist layer to an exposure energy, and developing the photoresist layer.

13 Claims, 3 Drawing Sheets

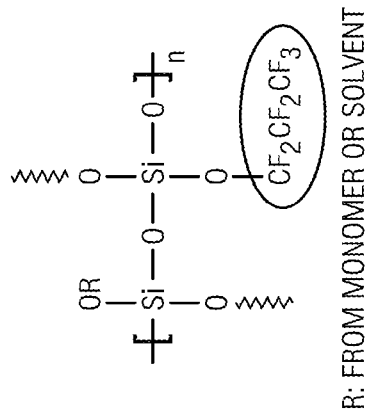
Fig. 6
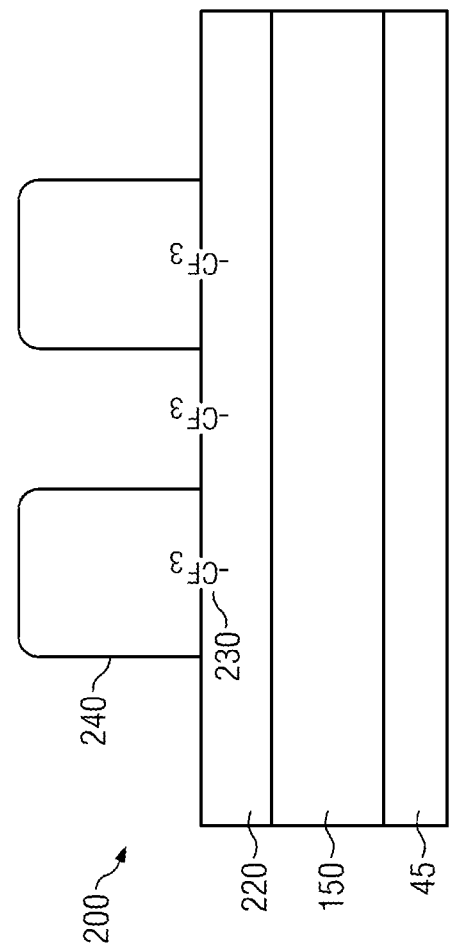
Fig. 4
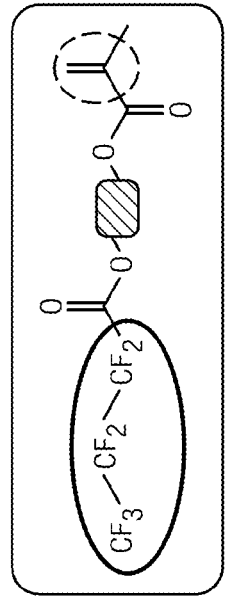
Fig. 5
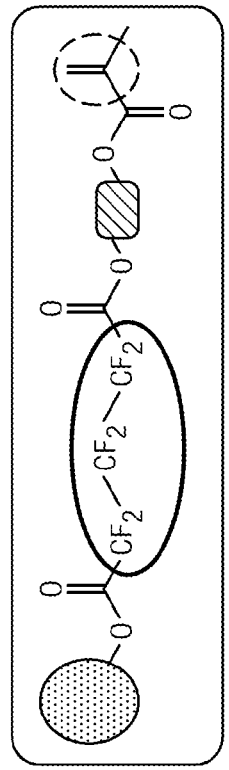

R: FROM MONOMER OR SOLVENT

SURFACE-MODIFIED MIDDLE LAYERS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. As lithographic features are reduced to below 40 nm, high numerical aperture processes are needed to overcome the resolution limit. The use of a trilayer films scheme appears to be promising in this regard.

In a trilayer films scheme, the contact angle of a middle layer is often mismatched with the contact angle of the photoresist layer. This can result in pattern peeling due to the deterioration of adhesion between the two layers. Another reason for pattern peeling may be an undercut profile that may be caused by non-uniform photoacid generator (PAG) distribution in the photoresist layer or the high reflectivity of the photoresist layer. Moreover, trench scum can result when PAG from the photoresist layer diffuses into the middle layer. Thus, a process and material that minimizes or removes these problems is desired.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIG. 4 is a sectional view of one embodiment of a semiconductor device constructed according to various aspects of the present disclosure.

FIG. 5 illustrates examples of fluorine-containing materials according to various aspects of the present disclosure.

FIG. 6 illustrates a fluorine-containing material chemically bound to a silicon polymer backbone according to various aspects of the present disclosure.

DETAILED DESCRIPTION

Figure 1:
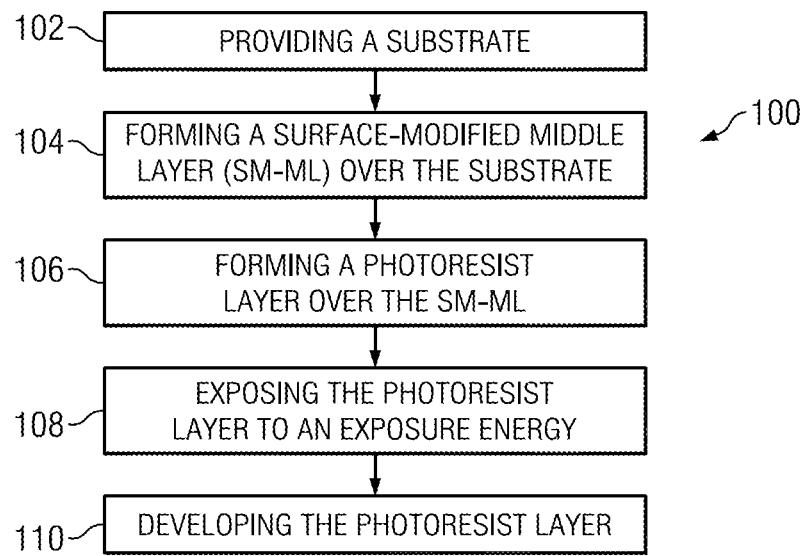
FIG. 1 is a flowchart of a method for making a semiconductor device in one embodiment according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
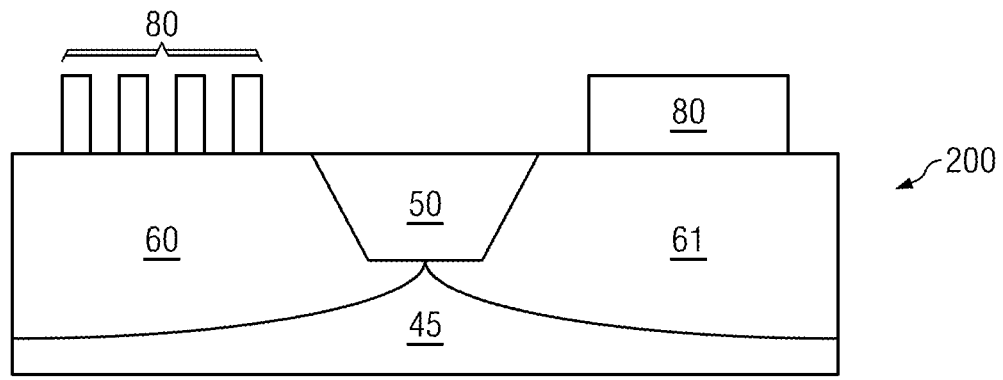
FIGS. 2 and 3 are diagrammatic fragmentary cross-sectional side views of a semiconductor substrate according to various aspects of the present disclosure.

FIG. 1 is a flowchart of one embodiment of a method 100 of making a semiconductor device 200 according to aspects of the present disclosure. The method 100 begins at step 102 by providing a semiconductor substrate. Referring to FIG. 2, the semiconductor device 200 may be a semiconductor Integrated Circuit (IC) chip, system on chip (SoC), or portion thereof, that may include memory circuits, logic circuits, high frequency circuits, image sensors, and various passive and active components such as resistors, capacitors, and inductors, P-channel field effect transistors (pFET), N-channel FET (nFET), metal-oxide semiconductor field effect transistors (MOSFET), or complementary metal-oxide semiconductor (CMOS) transistors, bipolar junction transistors (BJT), laterally diffused MOS (LDMOS) transistors, high power MOS transistors, or other types of transistors. It should be noted that some features of the semiconductor device 200 may be fabricated with a CMOS process flow.

The semiconductor device 200 includes a substrate 45. In the embodiment shown, the substrate 45 is a silicon substrate that is doped with a P-type dopant such as boron. In another embodiment, the substrate 45 is a silicon substrate that is doped with an N-type dopant such as arsenic or phosphorous. The substrate may alternatively be made of some other suitable elementary semiconductor material, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, in some embodiments, the substrate 45 could include an epitaxial layer (epi layer), may be strained for performance enhancement, and may include a silicon-on-insulator (SOI) structure.

Isolation structures such as isolation structure 50 are formed in the substrate 45. The isolation structure 50 includes a shallow trench isolation (STI) device. The STI devices contain a dielectric material, which may be silicon oxide, silicon nitride, silicon oxy-nitride, fluoride-doped silicate (FSG), and/or a low-k dielectric material known in the art. The STI devices are formed by etching trenches in the substrate 45 and thereafter filling the trenches with the dielectric material. In other embodiments, deep trench isolation (DTI) devices may also be formed in place of (or in combination with) the STI devices as the isolation structures.

Doped wells such as doped wells 60 and 61 may also formed in the substrate 45. The doped wells 60-61 are formed on either side of the isolation structure 50. In some embodiments, the doped wells 60-61 are doped with an N-type dopant such as arsenic or phosphorous. In some other embodiments, the doped wells 60-61 may be doped with a P-type dopant. The doping may be carried out using an ion implantation process or a diffusion process known in the art.

One or more device patterns 80 are formed over the substrate 45. The device patterns 80 may be components of IC circuit devices, for example polysilicon or metal gates of MOS transistors or other suitable semiconductor features. The device patterns 80 may be formed by one or more deposition and patterning processes. The deposition processes may include chemical vapor deposition (CVD), physical vapor deposition (PVD), atomic layer deposition (ALD), or other suitable deposition processes. The patterning processes may include a lithography process involving one or more masking, exposing, baking, developing, and rinsing processes (not necessarily in that order). One or more of the device patterns 80 may need to undergo further patterning later to form IC circuit device components.

Figure 3:
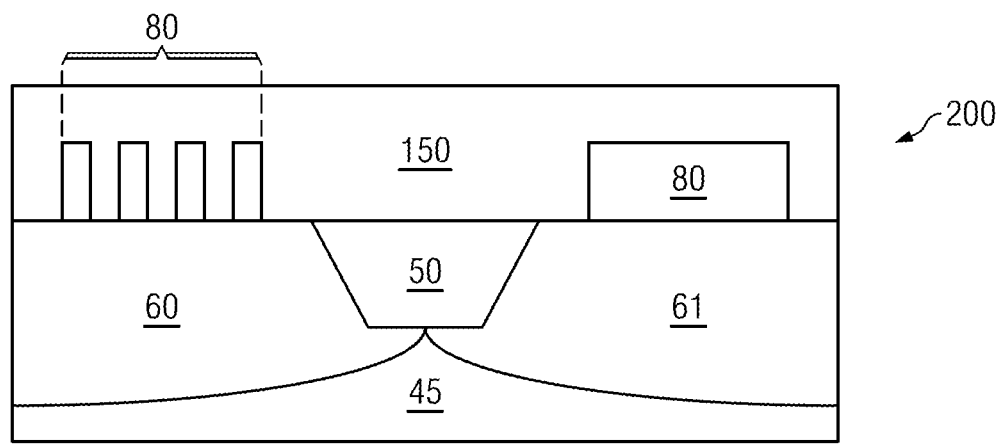

Referring now to FIG. 3, a layer 150 is formed over the substrate 45. The layer 150 is formed over and surrounds the device patterns 80. In some embodiments, the layer 150 may be formed by a spin coating process. In other embodiments, the layer 150 may be formed by another suitable deposition process. The layer 150 contains a material that is patternable. In some embodiments, the layer 150 contains an organic material. The organic material may include a plurality of monomers or polymers that are not cross-linked. As a result, the layer 150 is relatively soft.

Still referring to FIG. 3, to reduce the variations in wafer topography—in other words, to make the surface of the wafer flatter—an etching back process is performed on the layer 150. In some embodiments, the polishing process may includes a chemical-mechanical-polishing (CMP) process. The polishing process polishes away excess material at layer 150 to transform it into a flatter layer 150. The layer 150 has a substantially flat surface.

Referring now to FIG. 4 and step 104, a surface-modified middle layer (SM-ML) 220 is formed on the substrate 45. The SM-ML 220 includes a fluorine-containing material 230. FIG. 5 provides examples of suitable fluorine-containing materials 230. The fluorine-containing materials include a bulky group, a fluorine component, a spacer group, and a polymerization unit.

Examples of suitable bulky groups include a cyclic ring, norbornane, benzene, and adamantane. The bulky group assists in the contact angle and solubility control of the SM-ML 220.

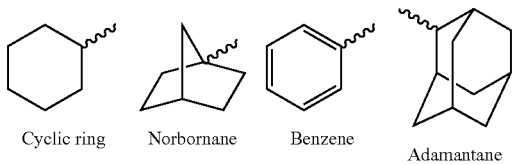

Cyclic ring  Norbornane  Benzene  Adamantane

The fluorine component helps to control the contact angle. Examples of suitable spacer groups include

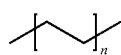

wherein the number of carbons is between about 2-8, or wherein n is between 1-4. For example, if there are 2 carbons, the spacer would be $C_2H_4$, and if there are 4 carbons, the spacer would be $C_4H_8$. In another embodiment, the spacer group may be $CH_2$. The spacers depend on the initial monomer type of the polymer in the SM-ML 220.

Lastly, the polymerization unit, in one embodiment, includes

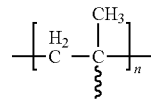

so that the fluorine-containing material 230 is represented by

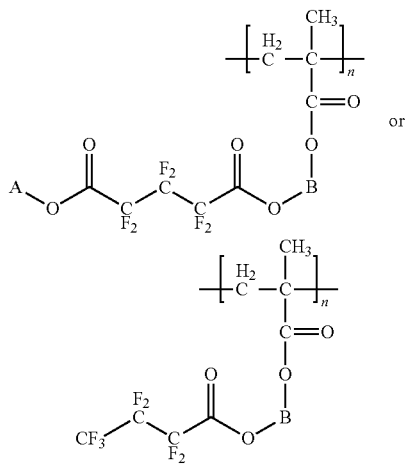

wherein A represents a bulky group and B represents a spacer, as described above.

The SM-ML 220 also includes a polymer and a solvent. The polymeric material may be cross-linked. In an exemplary embodiment, the polymer includes a silicon-containing organic polymer. The SM-ML 220 may also include a silicon-containing inorganic polymer. For example, the inorganic polymeric material may include silicon oxide. The SM-ML 220 may further include a metal-containing organic polymer material that contains metal such as titanium, titanium nitride, aluminum, and tantalum. In another embodiment, the SM-ML 220 may include silicon nitride or silicon oxynitride. The SM-ML 220 may include pure silicon such as polycrystalline silicon or silicon oxide. For example, the SM-ML 220 may include spin-on glass (SOG) known in the art. The SM-ML 220 may be thermally baked for cross-linking, thus without further requiring a solvent. Many traditional fabrication processes may be used to form the SM-ML 220.

In one embodiment, the fluorine-containing material 230 is blended with the other materials in the SM-ML 220, e.g., the silicon-containing organic polymer. In another embodiment, the fluorine-containing material 230 is chemically bound to the silicon polymer backbone, as illustrated in FIG. 6. In an exemplary embodiment, the fluorine-containing material 230 has a good solubility with the other components of the SM-ML 220.

A photoresist layer 240 is formed on the SM-ML 220 in step 106. For example, a spin-coating technique is utilized to form the photoresist layer 240 on the SM-ML 220. The photoresist layer 240 is a positive-type or negative-type resist material and may have a multi-layer structure. The photoresist layer 240 may utilize a chemical amplification (CA) resist material. In one embodiment, a positive CA resist material includes a polymer material that turns soluble to a developer such as a base solution after the polymer is reacted with acid. Alternatively, the CA resist material can be negative and include a polymer material that turns insoluble to a developer such as a base solution after the polymer is reacted with acid. The photoresist layer 240 further includes a solvent filling inside the polymer. The solvent may be partially evaporated by a soft baking process.

In one embodiment, the photoresist layer 240 also includes a photo-acid generator (PAG) distributed in the photoresist layer 240. When absorbing photo energy, the PAG forms a small amount of acid. Examples of suitable PAGs include salts of sulfonium cations with sulfonates, salts of iodonium cations with sulfonates, sulfonyldiazomethane compounds, N-sulfonyloxyimide PAGs, benzoinsulfonate PAGs, pyrogallol trisulfonate PAGs, nitrobenzyl sulfonate PAGs, sulfone PAGs, and glyoxime derivatives. An exemplary PAG is triphenylsulfonium nonaflate.

Referring back to FIG. 4, the concentration of the fluorine-containing material 230 in the SM-ML 220 may be adjusted to change the hydrophobicity of the SM-ML 220. That is, the greater the concentration of the fluorine-containing material 230 in the SM-ML 220, the more hydrophobic (oil-like) the SM-ML 220. The fluorine-containing material 230 has a low reactivity and makes the SM-ML 220 more hydrophobic, thus increasing the contact angle of the SM-ML 220. By including the fluorine-containing material 230 in the SM-ML 220, the contact angle mismatch between the photoresist layer 240 and the SM-ML 220 is reduced. A more hydrophobic SM-ML 220 improves adhesion of the SM-ML 220 to the photoresist layer 240 to improve photoresist pattern peeling. Reduced pattern peeling translates to sharper and more distinct features in the semiconductor device 200. Moreover, the increased hydrophobicity of the SM-ML 220 prevents hydrophilic developer solutions from penetrating the SM-ML 220 and causing collapse of the photoresist pattern during development of the photoresist layer 240.

The fluorine-containing material 230 also has a low surface energy and tends to move to the upper surface of the SM-ML 220. As illustrated in FIG. 4, the fluorine-containing material 230 may be more concentrated at the top of the SM-ML 220 compared to the lower portions of the SM-ML 220. It is believed that the fluorine-containing material 230 generates a thin, inner barrier layer in the SM-ML 220 that minimizes possible interactions between the photoresist layer 240 and the SM-ML 220.

In conventional trilayer film photolithography, the middle layer often has a porous structure. Because of this porous structure, small molecules such as PAGs can easily diffuse from the photoresist layer to the middle layer. This kind of chemical transfer often happens if the film density of the middle layer is not high enough. Due to the PAG diffusion into the middle layer, the PAG loss in the photoresist layer may cause trench scum.

In the present embodiment, the SM-ML 220 with the fluorine-containing material 230 in the upper surface forms a dense, inner barrier that prevents diffusion of the PAG into the SM-ML 220. This dense barrier prevents photoresist pattern peeling, decreases trench scum, and improves the photoresist profile. The resolution (contrast) of the resulting pattern is also improved. Features are clearer and more distinct.

After the photoresist layer 240 is formed, it is exposed to an exposure energy in step 108. In the exposing process step 108, the photoresist layer 240 is exposed to an exposure energy such as deep ultra-violet (DUV) through a photomask (mask or reticle) having a predefined pattern, resulting in a resist pattern that includes a plurality of exposed regions such as exposed features and a plurality of unexposed regions. In one embodiment, the exposure beam used to expose the photoresist layer 240 includes extreme ultraviolet (EUV) exposure and/or electron-beam (e-beam) writing. Alternatively, the exposure process may utilize other exposure beams, such as ion beam, x-ray, deep ultraviolet, and other proper exposure energy.

Subsequently, the photoresist layer 240 may be subjected to a post-exposure bake (PEB). The coated photoresist layer 240 may be baked, referred to as pre-baking process, to reduce the solvent.

The method proceeds to step 110, where the photoresist layer 240 is developed by any suitable process to form a pattern in the photoresist layer 240. A developing solution may be utilized to remove portions of the photoresist layer 240. An example of a developing solution is tetramethylammonium hydroxide (TMAH). Any concentration level of TMAH developer solution may be utilized, such as approximately 2.38% TMAH developer solution. The developing solution may remove the exposed or unexposed portions depending on the resist type. For example, if the photoresist layer 240 comprises a negative-type resist, the exposed portions are not dissolved by the developing solution and remain over substrate 45. If the photoresist layer 240 includes a positive-type resist, the exposed portions are dissolved by the developing solution, leaving the unexposed portions behind. The semiconductor device 200 may then be subjected to a rinsing process, such as a de-ionized (DI) water rinse. The rinsing process may remove residue particles.

Figure 7:
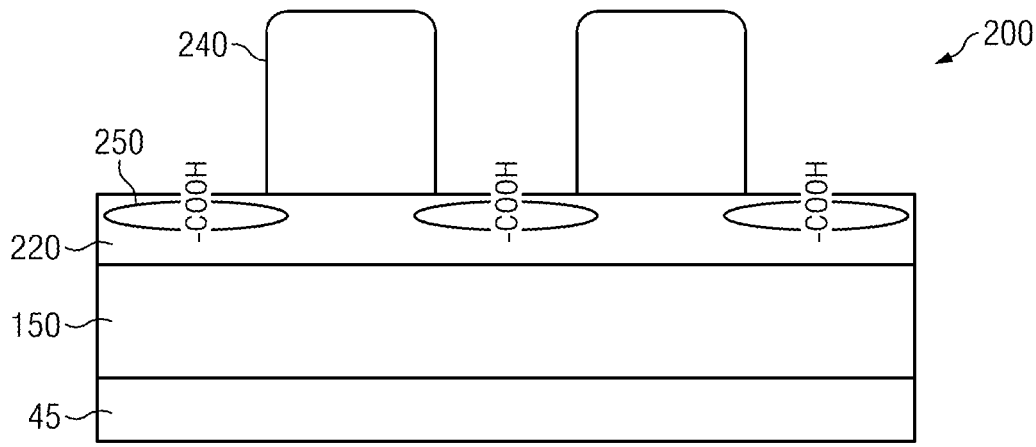
FIG. 7 is a sectional view of another embodiment of a semiconductor device after exposure according to various aspects of the present disclosure.
Figure 8:
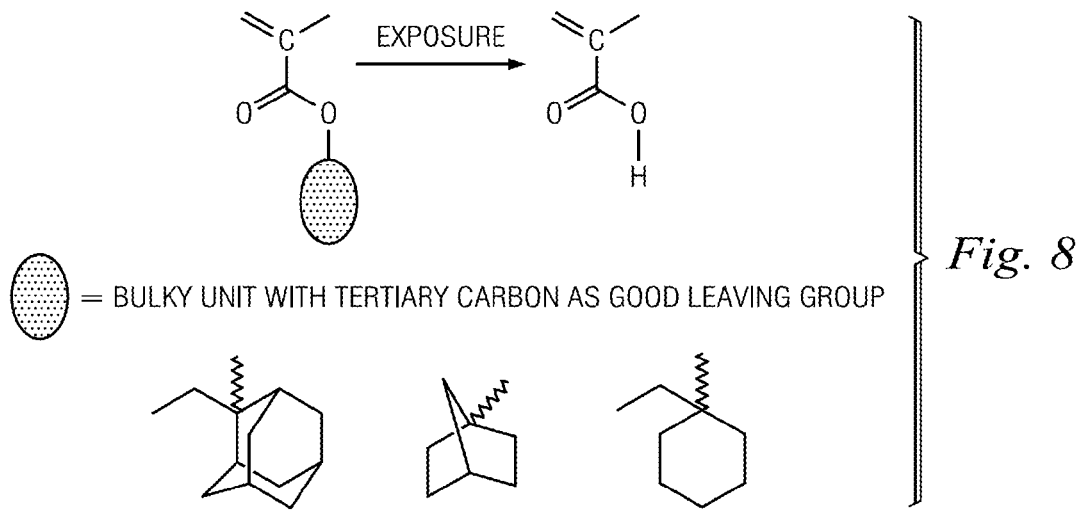
FIG. 8 illustrates an example of a compound with an acid labile group and its conversion after exposure.

Turning now to FIG. 7, another embodiment of the semiconductor device 200 is illustrated. In this embodiment, the SM-ML 220 includes a material that makes the SM-ML 220 to become more hydrophilic after exposure. In the illustrated embodiment, the material includes a compound with an acid labile group (ALG) (not shown). FIG. 8 provides an example of a compound with an ALG and illustrates its conversion into a compound with an acid group 250 after exposure. In an exemplary embodiment, the ALG includes a bulky unit with a tertiary carbon as a good leaving group, such as those shown in FIG. 8.

Figure 9:
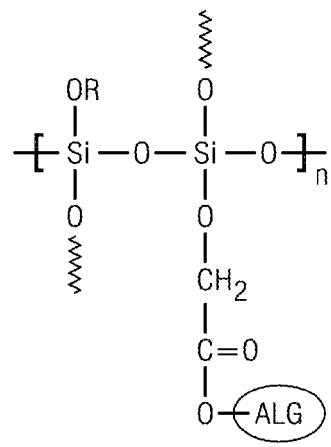
FIG. 9 illustrates a compound with an acid labile group chemically bound to a silicon polymer backbone.

In one embodiment, the compound with the ALG is blended with the other materials in the SM-ML 220, e.g., the silicon-containing organic polymer. In another embodiment, the compound with the ALG is chemically bound to the silicon polymer backbone, as illustrated in FIG. 9. In an exemplary embodiment, the compound with the ALG has a good solubility with the solvent of the SM-ML 220.

Without being bound by theory, in embodiments where a PAG is present in the photoresist layer 240, the acid formed during exposure reacts with the compound with the ALG to yield a compound with an acid group 250. Areas of the photoresist layer 220 that are exposed to photoenergy produce small amounts of acid that are able to diffuse and react with the compound with the ALG in the SM-ML 220. The resulting SM-ML 220, which includes a compound with an acid group 250, is more hydrophilic after exposure and decreases the contact angle of the SM-ML 220. In turn, this causes the SM-ML 220 to be more soluble in the developer solution, which improves trench scum and residue defects in the exposed areas.

The remaining exposed portions (or unexposed portions) in the photoresist layer 240 define a pattern. The pattern contains one or more openings or trenches, wherein portions of the underlying substrate 45 are exposed. Subsequent processing may include removing the exposed portions of the substrate 45 within the openings. The patterned photoresist may then be removed (or stripped) by any suitable process. For example, the patterned photoresist may be removed with a fluid (or stripping solution). The semiconductor device 200 may be subjected to one or more processes, such as additional patterning, etching, deposition, etc. processes, to form additional features of the semiconductor device 200. The SM-ML 220 is eventually removed.

Various advantages may be present in one or more embodiments of the method 100 and the semiconductor device 200. The present disclosure provides a new material for a middle layer in a trilayer film scheme. The methods and material improve photoresist pattern peeling and trench scum by integrating different materials into the middle layer. Sharper pattern resolutions are obtained without the use of expensive machines or complex process steps.

One of the broader forms of the present disclosure relates to a method of making a semiconductor device. The method includes providing a substrate, forming a surface-modified middle layer (SM-ML) comprising a fluorine-containing material over the substrate, forming a photoresist layer over the SM-ML, exposing the photoresist layer to an exposure energy, and developing the photoresist layer.

Another one of the broader forms of the present disclosure involves another method of making a semiconductor device. The method includes providing a substrate, forming a surface-modified middle layer (SM-ML) comprising a fluorine-containing material and a compound with an acid labile group (ALG) over the substrate, forming a photoresist layer over the SM-ML, exposing the photoresist layer to an exposure energy, and developing the photoresist layer.

The present disclosure also describes a material used in photolithography patterning. The material includes a polymer and a fluorine-containing material. The fluorine-containing material increases the hydrophobicity of an upper surface of the material when the material is coated over a substrate.

Other process steps may be implemented before, during and/or after the method 100. The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making a semiconductor device, the method comprising:
    providing a substrate;
    forming a surface-modified middle layer (SM-ML) comprising a fluorine-containing material over the substrate, wherein an upper surface of the SM-ML contains a higher concentration of fluorine-containing material compared to lower portions of the SM-ML;
    forming a photoresist layer over the SM-ML;
    exposing the photoresist layer to an exposure energy; and
    developing the photoresist layer.

2. The method of claim 1, wherein the upper surface is more hydrophobic compared to the lower portions of the SM-ML.

3. The method of claim 2, wherein a degree of hydrophobicity is adjustable based on a concentration of the fluorine-containing material.

4. The method of claim 1, wherein forming the SM-ML comprises blending a silicon polymer with the fluorine-containing material, chemically binding the fluorine-containing material to a silicon polymer backbone, or both.

5. The method of claim 1, further comprising adding a photoacid generator to the photoresist layer.

6. The method of claim 1, further comprising adding a material to the SM-ML that makes the SM-ML more hydrophilic after exposure.

7. The method of claim 6, wherein the material comprises a compound with an acid labile group.

8. The method of claim 6, wherein adding the material to the SM-ML comprises blending a silicon polymer with the material, chemically binding the material to a silicon polymer backbone, or both.

9. The method of claim 6, wherein after exposing the photoresist layer, a portion of the SM-ML under an exposed portion of the photoresist layer becomes more hydrophilic.

10. A method of making a semiconductor device, the method comprising:
    providing a substrate;
    forming a surface-modified middle layer (SM-ML) comprising a fluorine-containing material and a compound with an acid labile group (ALG) over the substrate, wherein an upper surface of the SM-ML contains a higher concentration of fluorine-containing material compared to lower portions of the SM-ML;
    forming a photoresist layer over the SM-ML;
    exposing the photoresist layer to an exposure energy; and
    developing the photoresist layer.

11. The method of claim 10, wherein the upper surface is more hydrophobic compared to lower portions of the SM-ML.

12. The method of claim 10, wherein after exposing the photoresist layer, a portion of the SM-ML under an exposed portion of the photoresist layer becomes more hydrophilic.

13. The method of claim 12, wherein the portion of the SM-ML comprises compound with an acid group.

* * * * *